United States Patent [19]

Smith

[11] Patent Number: 5,077,690
[45] Date of Patent: Dec. 31, 1991

[54] MEMORY INPUT DATA TEST ARRANGEMENT

[75] Inventor: Paul J. Smith, Colorado Springs, Colo.

[73] Assignee: Atmel Corporation, San Jose, Calif.

[21] Appl. No.: 391,059

[22] Filed: Aug. 9, 1989

[51] Int. Cl.$^5$ .................. G11C 29/00; G11C 7/00
[52] U.S. Cl. .................. 365/201; 365/189.03; 365/189.08; 365/189.05; 365/189.07; 365/230.08
[58] Field of Search ............... 365/189.07, 189.05, 365/201, 230.08, 189.03, 189.08

[56] References Cited

U.S. PATENT DOCUMENTS

| | | | |
|---|---|---|---|
| 3,484,754 | 12/1969 | Siuda | 365/189.07 |
| 4,592,052 | 5/1986 | Iwasa | 365/201 |
| 4,608,669 | 8/1986 | Klara et al. | 365/201 |
| 4,654,827 | 3/1987 | Childers | 365/201 |
| 4,689,772 | 8/1987 | Jordy et al. | 365/201 |
| 4,811,294 | 3/1989 | Kobayashi et al. | 365/201 |
| 4,875,195 | 10/1989 | Momodomi et al. | 365/189.07 X |

FOREIGN PATENT DOCUMENTS 52-31630 10/1977 Japan.
55139697 10/1989 Japan.

OTHER PUBLICATIONS

"Functional and Level Fail Detection for Register Array Testing," P. Heavey et al, IBM Technical Disclosure Bulletin, vol. 15, No. 4, 9/72, pp. 1135-1136.
"Clock and Counter Hardware Compose Static RAM Chip Tester That Writes, Reads, and Validates Test Data Patterns for Different Memory Organizations by Modifying Counter Bit Lengths and Clock Phases," A. Bently, Computer Design, 6/79, pp. 124-136.
"Test Catches RAM Errors at Max Speed," M. Stofka, Design Ideas, EDN, vol. 26, No. 8, 4/15/81, pp. 150, 152.

Primary Examiner—Alyssa H. Bowler
Attorney, Agent, or Firm—Schneck & McHugh

[57] ABSTRACT

A memory system in which the input/output circuitry can be tested independently from the storage cells and decoder therein by permitting a write operation, with information at the memory inputs being provided to the memory outputs as well as to the storage cells.

8 Claims, 3 Drawing Sheets

MEMORY INPUT DATA TEST ARRANGEMENT

BACKGROUND OF THE INVENTION

The present invention relates to testing of digital memory circuits and, more particularly, on-chip circuitry for isolating malfunctions in a random access memory (RAM) circuit formed in a monolithic integrated circuit semiconductor chip.

In a monolithic integrated circuit memory chip, the number of memory circuits internal thereto that may be electrically isolated from other such circuits and individually tested is limited by the number of external interconnection pads available on that chip. The number of interconnection pads is limited by the space available on that chip as designed. The tradeoff for the use of an additional interconnection pad for providing access to an internal circuit is the loss of such an interconnection pad for access to another internal circuit. A determination of how to maximize electrical access to the internal circuits in that chip with its limited number of possible pads must be made as part of the design. This often involves providing the interconnection pads with alternative internal circuit connections by switches provided in a multiplexing arrangement such that each pad has multiple alternative internal connections.

If an error arises in the operation of the memory circuit, the limited number of interconnection pads available to provide access to internal memory circuits often makes impossible the precise isolation of the circuit which is malfunctioning. One example of a testing procedure used for testing monolithic integrated circuit chips with RAM circuits is done by simply writing data into every memory location therein and then reading this data out. If the data read-out is not the same as was written, the RAM circuit is determined to be malfunctioning. Without further investigation (possibly requiring an electron microscope), the malfunction location or circuit cannot be determined as it may have occurred in any of the memory cells, the decoders, or the input/output (IO) circuitry.

Achieving improvements in quality in such RAM circuit chips, malfunctions must be isolated to a particular certain circuit or component therein. Then the cause may be determined. Hence, the RAM circuit chip may be redesigned with those improvements to avoid further such malfunctions.

A desirable RAM circuit chip would permit testing certain circuits or circuit groups separately so that any particular faulty circuit therein can be found.

SUMMARY OF THE INVENTION

The present invention allows the input/output circuitry in a memory to be tested independently from the storage cells and decoder of the memory by permitting a write operation with information at the memory inputs being provided to the memory outputs as well as to the storage cells in a test procedure. In normal memory operation, such information reaches only the storage cells and not the memory outputs. A control circuit is provided ahead of the usual memory control inputs of read/write selection, output latch enable and sense amplifier enable. The control circuit generates the needed signals from those inputs based on the system clock signal and a system read/write control signal with differing characteristics for normal write operation and write operations which permit testing of input information.

If an error occurs during a write operation permitting concurrent output information, the malfunction must be within the input/output circuitry. This additional diagnostic information is thus made available even though no additional interconnection pads to the memory are used if implemented in a monolithic integrated circuit.

DETAILED DESCRIPTION OF THE PREFERRED EMBODIMENTS

Figure 1:
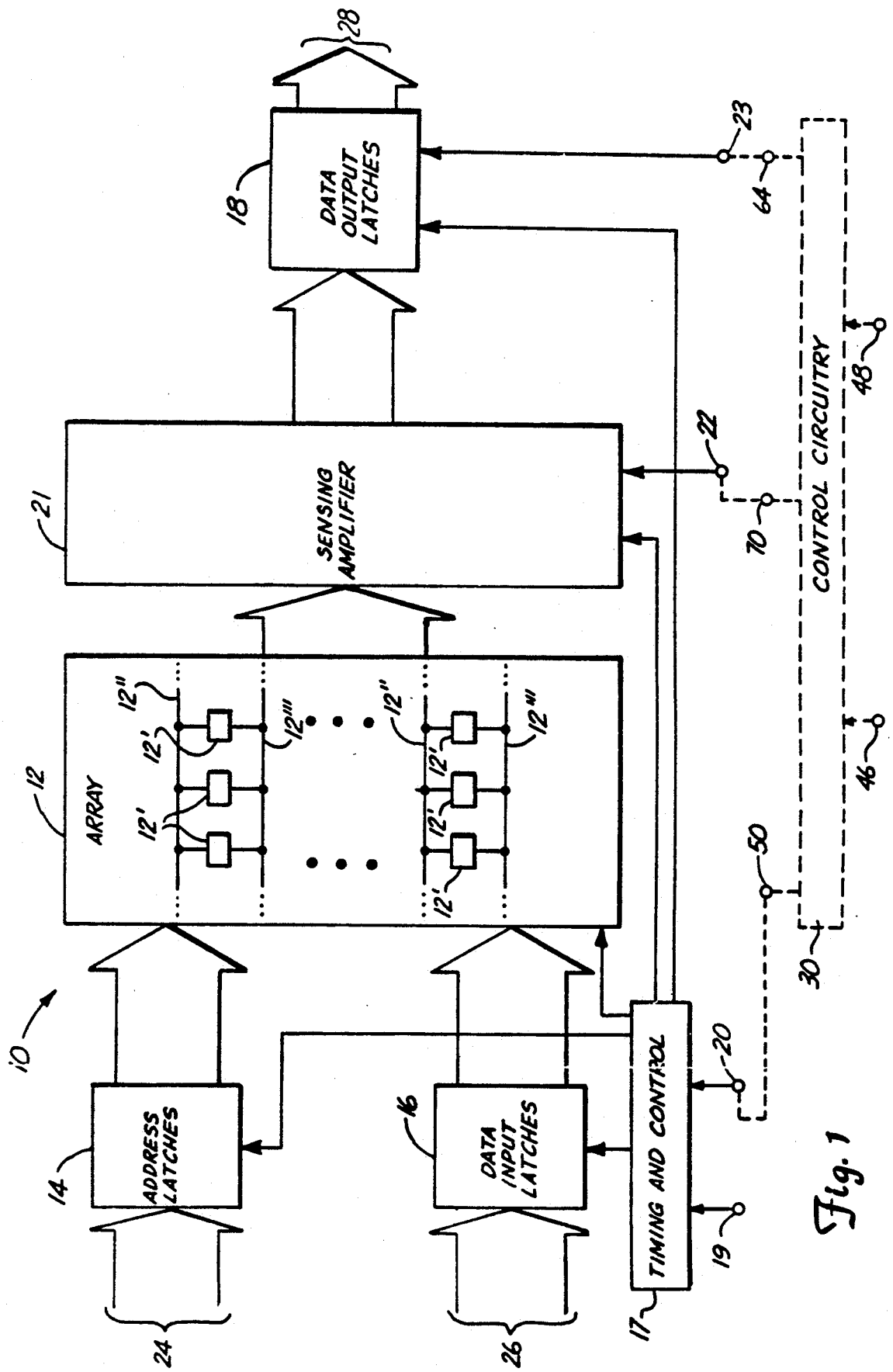
FIG. 1 is a block diagram of the RAM circuit memory array of the present invention.

FIG. 1 shows a RAM circuit memory, 10, in block diagram form. Memory 10 includes an array of information storage cells, 12, including individual cells, 12', a set of address latches, 14, a set of data input latches, 16, a set of sense amplifiers, 21, a set of data output latches, 18, and a timing and control circuit, 17. RAM circuit 10 is typically fabricated in a monolithic integrated circuit chip using well known technology.

Timing and control circuit 17 has a clock signal input, 19, and a read/write control input terminal, 20. Sense amplifiers 21 have a sense amplifier enable signal input terminal, 22. Address latches 14 have a set of inputs, 24. Data input latches 16 have a set of inputs, 26. Data output latches 18 have an output latch enable signal input terminal, 23, and a set of outputs, 28.

Address latches 14, data input latches 16, and data output latches 18 all have clock signal input connections (not shown) for receiving an externally supplied periodic clock voltage signal. During a portion of a period in a cycle of the clock signal, latches 14, 16 and 18 "latch" or maintain output voltages representing logic states reflected in the logic state voltage signals present on the inputs thereof at the beginning of this latch period portion despite any subsequent input logic state changes occurring during the remainder of such a period portion. During another portion of that period in the clock cycle, the data at the outputs of latches 14, 16 and 18 is not "latched" and so is free to change with changes in the logic state voltage levels of the inputs thereof.

Appropriate logic state voltage signals may be supplied to inputs 24 of address latch 14 to select an individual storage cell within storage cell array 12 for read or write operations. Logic state voltage signals are supplied to inputs 26 of data input latch 16, representing information, for the purpose of storing such data within the cells of array 12, during a write operation. Data output latches 18 are connected to sense amplifiers 21 within the array for receiving and "latching" logic state voltage signals provided from cells in array 12 to the sense amplifier in a memory read operation.

RAM circuit memory 10 may be readied for a write operation by applying an externally supplied high logic state voltage signal to read/write control signal input terminal 20. During a write operation, data presented to storage cell array 12 from data input latches 16 is stored within selected storage cells within array 12 as specified by a corresponding logic state signal address representation provided to array 12 from address latches 14 supplied from an external source during an appropriate portion of a period of the clock signal cycle.

The sense amplifiers in ordinary memory operation are not enabled to sense during a write operation. However, if sense amplifiers 21 within array 12 are enabled by applying a high logic state voltage signal to sense amplifier enable signal input connection 22, the data being written into the selected cells in array 12 from data input latches 16 is received also by the sense amplifiers of array 12. This occurs because the storage cell input interconnections are electrically in common with the storage cell output interconnections. Typically each cell 12' has a pair of inputs connected to a pair of interconnections, 12" and 12''', which extend therefrom to the outputs of input data latches 16 and inputs of sense amplifiers 21 to serve as both the cell input and output interconnections. Thus, both sensed and stored data would then be passed to data output latches 18 If data output latches 18 are enabled by placing a high logic state voltage signal on output latch enable input signal terminal 23, the data presented to data output latch 18 by these sense amplifiers is "latched" on data output latch outputs 28 by data output latch 18 during a selected portion of a period of the clock signal cycle. This possible, though unusual, mode of operation during a write operation will be made use of below.

For a read operation, an externally supplied low logic state voltage signal is applied to read/write control signal input terminal 20 to ready RAM circuit memory 10 for that operation. The data stored in selected storage cells within array 12, corresponding to an address specified by appropriate logic state signals supplied externally to address latches 14, is sensed by the enablement of sense amplifiers 21 within array 12, and is then presented to data output latches 18. These received logic state voltage signals are "latched" by data output latches 18, and presented on data output latch outputs 28.

An additional control circuit, 30, is indicated by dashed lines in FIG. 1 as a modification of the solid line portion shown in that figure and described above as RAM circuit memory 10.

Figure 2:
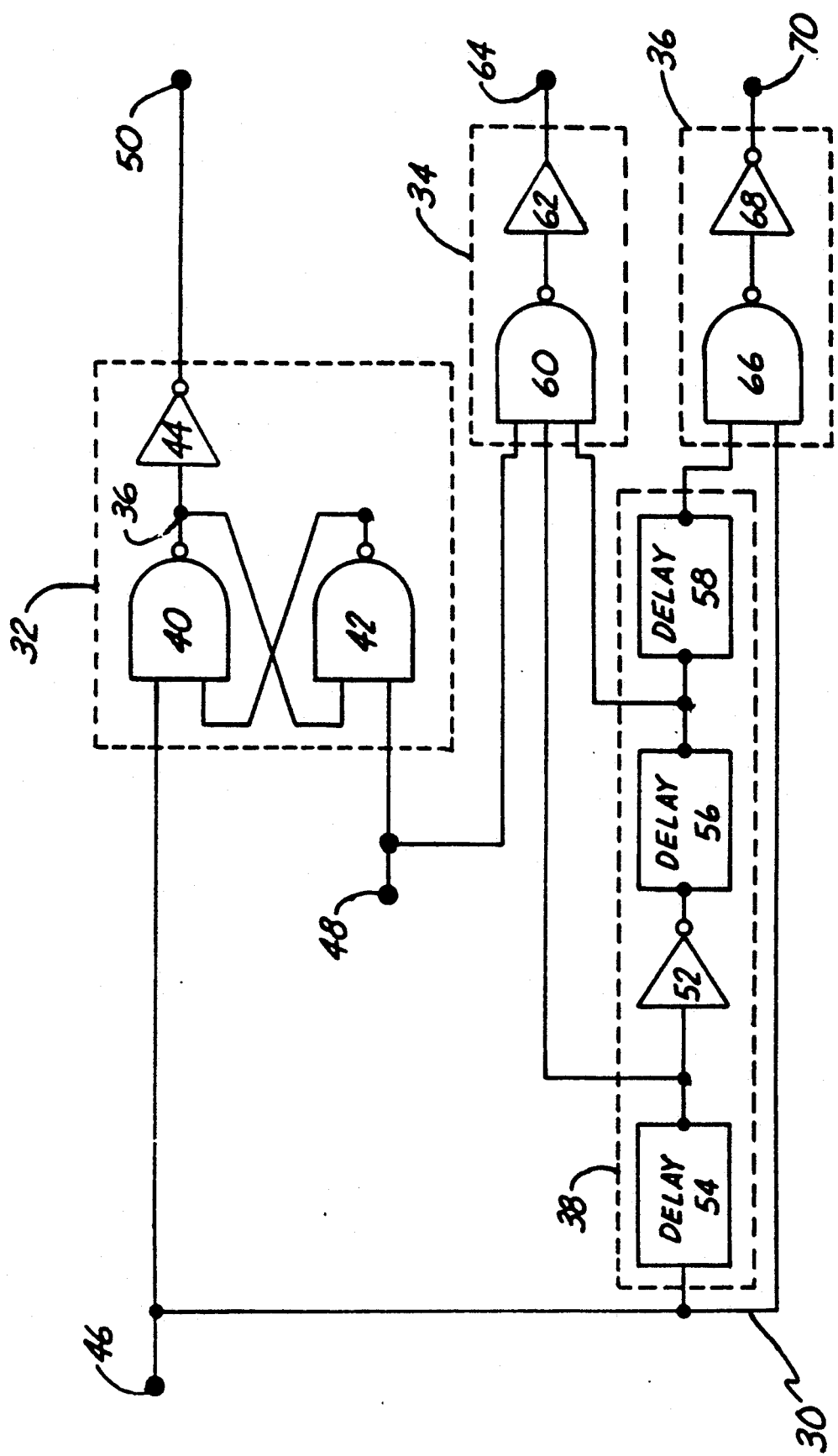
FIG. 2 is a logic diagram of the control system of the present invention.

Referring now to FIG. 2, control circuit 30 is shown in more detail for use with RAM circuit memory 10 shown in FIG. 1. Control circuit 30 includes a bistable circuit or flip-flop, 32, a first pulse former circuit, 34, a second pulse former, 36, and a signal propagation delay system circuit, 38.

Flip-flop 32 is an R-S type flip-flop comprising a pair of two-input cross coupled NAND gates, 40 and 42, with a logic state inverter, 44, connected to the output of two-input NAND gate 40. This R-S flip-flop configuration is formed by connecting the output of each of two-input NAND gates 40 and 42 to one of the inputs of the other. The remaining input of two-input NAND gate 40 is connected to a system clock signal input connection, 46. The remaining input of two-input NAND gate 42 is connected to a system read/write control signal input terminal, 48. The output of two-input NAND gate 40 is connected through inverter 44 to a control circuit read/write control signal output terminal, 50.

Propagation delay system circuit 38 includes a logic state inverter, 52, and signal propagation delay circuits, 54, 56, and 58. The input of delay circuit 54 connects to system clock input signal terminal 46. Delay circuits 54, 56 and 58 are connected in series with inverter 52 interposed between delay circuits 54 and 56. Delay circuits 54, 56 and 58 each provide a delay in signals transmitted therethrough of a substantially equal duration.

First pulse former 34 includes a three-input NAND gate, 60, and a polarity maintaining output driver, or buffer, 62. One input of three-input NAND gate 60 connects to system read/write control signal terminal input 48. Another input of three-input NAND gate 60 connects to delay line circuit 38 at a point between delay circuit 54 and inverter 52. The remaining input to three-input NAND gate 60 connects to delay circuit 3 between delay circuit 56 and delay circuit 58. The output of buffer 62 is connected to a control circuit output latch enable output signal terminal, 64.

Second pulse former 36 comprises a two-input NAND gate, 66, and an inverter, 68. One input of two-input NAND gate 66 connects to the output of delay circuit 58 and the other input thereof connects to system clock signal input terminal 46. The output of two-input NAND gate 66 is connected through a logic state inverter, 68, to a control circuit sense amplifier enable output signal terminal, 70.

Control circuit 30 is intended to be fabricated in the same monolithic integrated circuit chip as is RAM circuit memory 10. Control circuit 30 output terminals 50, 64 and 70 are to be joined with input terminals 20, 23 and 22, respectively, of memory 10, as seen in FIG. 1. Thus, the signal inputs 20, 23 and 22 of the memory system of FIG. 1 will have substituted therefor the inputs of control circuit 30 in the modification of Figure provided by the addition thereto of control circuit 30. The system clock input terminal 46 and the system read/write control signal input terminal 48 are part of pad interconnections for receiving externally supplied logic state voltage signals.

Control circuit 30 allows a modified write operation for the testing of RAM circuit memory 10 in such a manner so as to permit isolating the source within memory 10 of any errors found. Control circuit 30 is operated by logic state voltage signals applied to system clock signal input terminal 46 and system read/write control signal input terminal 48. System clock signal input terminal 46 is supplied externally the same periodic clock voltage signal as is provided to RAM circuit memory 10.

A change in the clock input signal from a low logic state voltage level to a high logic state voltage level is to initiate either a read or a write operation in the modified memory system depending on which logic state level is presented in the signal on system read/write control signal input terminal 48. If the logic state voltage signal present at system read/write control signal input terminal 48 is at a high logic state voltage level as the transition in logic states from low to high in the system clock signal at system clock signal input terminal 46 is occurring, then a read operation is to be initiated in the modified memory system. In memory system 10 before modification, the opposite logic state was used on terminal 20 to initiate a read operation. If the same external signal is to be used on the modified memory system to control selections of read and write operations, an inverter can be used. Similarly, if a low logic state is present at system read/write control signal input terminal 48 as such a rising logic occurring at system clock signal input terminal 46, a write operation is to be initiated in the modified memory system.

Flip-flop 32 is used as a latch circuit. A rising logic state transition at system clock signal input terminal 46 will cause control circuit read/write control signal output terminal 50 to be "latched" at a high logic state voltage value if the logic state present on system read/write control signal input terminal 48 is low. This follows since an R-S flip-flop formed by a pair of two-input signal cross-coupled NAND gates, as is well known, causes a high logic state to occur on the output of the opposite member of the pair from that member having a high logic state input introduced on its remaining input. A low logic state is assumed occurring on the remaining input of that opposite member. Thus, with a low logic state on terminal 48, a rising voltage on terminal 46, at the time of passing the switching threshold of flip-flop 32, will cause a high logic state at the output of gate 42. A corresponding complementary low logic state will occur on the output of gate 40 which inverter 44 will transform to a high logic state on terminal 50. Thus, the modified memory is readied for a write operation by having a high logic state on terminal 50 and so on terminal 20 to which it is connected.

Similarly, if the logic voltage signal present at system read/write control signal input terminal 48 is at a high logic state for a rising logic state transition at system clock signal input terminal 46, flip-flop 32 before such a clock state transition will have a high logic state at the output of gate 40 and a corresponding low logic state at the output of gate 42. Inverter 44 will transform the high logic state on the output of gate 40 to a low logic state on terminal 50. As is well known for an R-S flip-flop formed of a pair of two-input cross-coupled NAND gates, if the remaining inputs of both gates are brought to high logic states, the logic states on the outputs will not change. Thus, input control circuit read/write control signal output terminal 50 will be latched at a low logic voltage level to ready the modified RAM circuit memory for a read operation with a low logic state provided on terminals 50 and 20.

First pulse former 34 maintains a high logic state output at terminal 64 except for the situation of all inputs thereto each being in a high logic state which will lead to a low logic state output. This is just the well known operation of a NAND gate which is the primary logic element of pulse former 34. The output signal of NAND gate 60 is unaffected insofar as the logic states therein are concerned by buffer 62 and so appear directly on terminal 64. In these situations in which a logic state voltage signal has propagated through delay system circuit 38 past delay circuit 56, the logic states at the outputs of delay circuits 54 and 56 will be opposite that of the other because of inverter 52. As a result, NAND gate 60 will have its output in a high logic state without regard to the logic state occurring at terminal 48.

The situation immediately following transactions between logic states in the system clock signal can differ, however. As a logic state voltage signal from system clock signal input terminal 46 propagates along the delay circuit 38, this signal is delayed in reaching the output of delay circuit 56 after reading the output of delay circuit 54 by the amount of delay provided by delay circuit 56. During the duration of this delay provided by delay circuit 50, the two inputs of NAND gate 60 at the outputs of delay circuits 54 and 56 will have the same logic state voltage signals thereon. As a result, the logic state during this delay will depend on the logic state occurring at terminal 48.

Second pulse former 36 generates a high logic state at its output when the system clock signal changes from a low logic state to a high one. This high logic state at terminal 70 ends and the output signal thereof returns to a low logic state after the system clock signal returns to a low logic state. If a low logic state at terminal 46 has been present sufficiently long so that propagation thereof through delay circuits 54, 56 and 58 is complete, the inputs to NAND gate 66 will be opposite one another because of inverter 52. The output of this gate will then be a high logic state so that inverter 68 causes a low logic state to occur on terminal 70. A system clock signal transition to a high logic state will cause the inputs to gate 66 to have identical logic states until propagation through the delay circuits is complete. The output of gate 66 changes to the low logic state until such propagation is complete upon which it reverts to the high logic state. A transition in the system clock signal back to a low logic state leaves the output of gate 66 unchanged. The amount of time that the high logic state occurs on output 70 during a clock cycle is set by the total amount of delay provided in delay circuits 54, 56 and 58.

Figure 3:
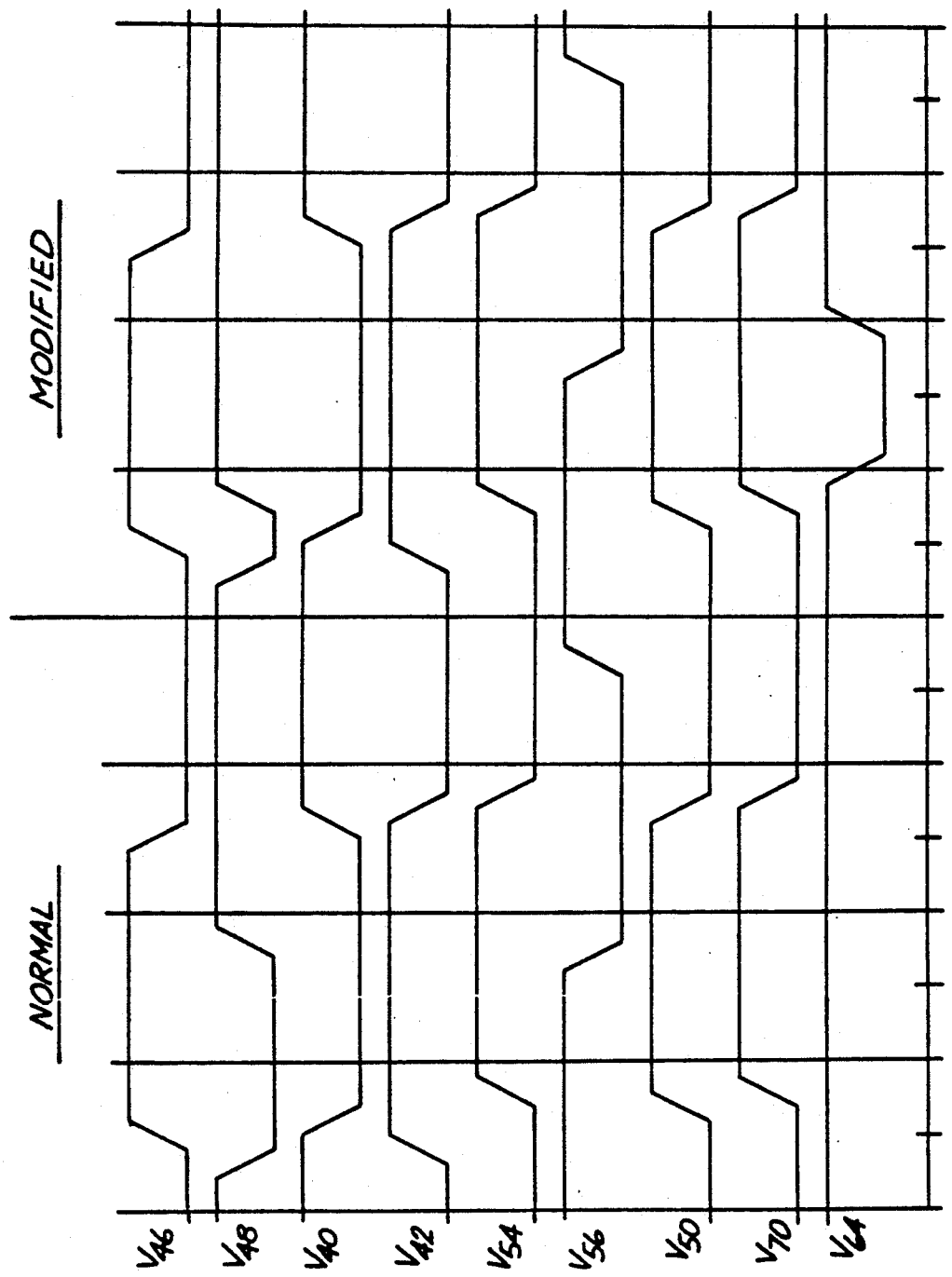
FIG. 3 is a logic timing diagram for the control system shown in FIG. 2.

Logic state voltage signal waveforms for a normal write operation for the modified memory are shown in FIG. 3 on the left followed by those for a modified write operation on the right, each taking one clock signal cycle. Logic state voltage signal $V_{48}$ is provided at system read/write control signal input terminal 48 differs in a modified write operation from its form in a normal write operation. In each operation, the time relationship between the falling edge of voltage signal $V_{48}$ and the rising edge of clock logic state voltage signal $V_{46}$, provided at system clock signal input terminal 46, is identical. In the normal write operation on the left in the first clock cycle shown, however, voltage signal $V_{48}$ stays in a low logic state for a much greater portion of the period than in the modified write operation shown on the right for the second cycle of clock voltage signal $V_{46}$. This difference is what determines whether the write operation will be a normal one or a modified one.

In each of the write operations, the rising logic state transition initially occurring in voltage signal $V_{46}$, the system clock signal provided to system clock signal input terminal 46, causes flip-flop 32 to provide at the output of gate 40 a low logic state, as indicated above, after voltage signal $V_{48}$, provided to the system read/write control signal input terminal 48, has fallen to a low logic state. As a result, control circuit read/write control signal output terminal 50 will have a high logic state thereon, as shown in logic state voltage signal $V_{50}$, which remains until system clock voltage signal $V_{46}$ falls to a low logic state. The subsequent transition of voltage signal $V_{48}$ to a high logic state places the inputs to gate 44 both in a high logic state leaving the output of gate 44 the same until clock voltage signal $V_{46}$ falls. Therefore, the waveform of logic state voltage signal $V_{50}$ is the same for both normal and modified write operations.

Propagation delay system circuit 38 and pulse former 36 are not connected in FIG. 2 to receive the system read/write control voltage signal $V_{48}$ at terminal 48, or any signal depending on $V_{48}$. Thus, logic state voltage signal $V_{70}$ at output 70 of pulse former 36 is periodic since it depends on only system clock voltage signal $V_{46}$ which is periodic. As a result, signal $V_{70}$ is also identical in both the normal and the modified write operations.

The logic state voltage signal $V_{64}$ taken at output latch enable signal output terminal 64, however, differs between the two write operations because it depends on voltage signal $V_{48}$ which is provided at terminal 48 so as to differ between these write operations, as indicated above, as the basis for selecting one operation or the other. In the normal write operation shown in FIG. 3 on the left, logic state voltage signal $V_{64}$ remains in the high logic state entirely. Signal $V_{64}$ will only fall to a low logic state if logic state voltage signals $V_{48}$, $V_{54}$ and $V_{56}$ at NAND gate 60 are all simultaneously in a high logic state. Since voltage signal $V_{48}$ at system read/write control signal input terminal 48 is in a low logic state in a normal write operation during the delay through delay circuit 56 which is the only time voltage signals $V_{54}$ and $V_{56}$ are each in a high logic state simultaneously, signal $V_{64}$ remains in a high logic state.

In a modified write operation, voltage signal $V_{48}$ at system read/write control signal input terminal 48 rises from a low logic state to a high logic state very shortly after the time system clock voltage signal $V_{46}$ rises to a high logic state to specify a write operation. Since signal $V_{48}$ completes this rise during the delay time through delay circuit 56, so that both signals $V_{54}$ and $V_{56}$ are in a high logic state, the output of NAND gate 60 drops to a low logic state as then does voltage signal $V_{64}$. Signal $V_{64}$ stays low until the delay of the logic state transition from the output of delay circuit 54 is over so that a transition occurs at the output of delay circuit 56. The outputs of these delay circuits will then be in opposite logic states, as can be seen in signals $V_{54}$ and $V_{56}$, and so the output of gate 60 will rise to a high logic state.

The low logic state pulse in voltage signal $V_{64}$ can be seen to be coincident with a high logic state in voltage signal $V_{70}$. Thus, sense amplifiers 21, which are permitted to sense signals occurring in array 12 by the presence of a high logic state in voltage signal $V_{70}$ on terminals 70 and 22, provide output logic state signals to data output latches 18 where they are "latched" at the presence of a low logic state pulse in voltage signal $V_{64}$ at terminals 64 and 23. The logic state signals that can be sensed by sense amplifiers 21 during a write operation are just the data signals which are being stored in array 12 during this operation. The logic state signal data in the data output latches 18 can be taken at outputs 28 thereof to permit it to be compared with the logic state signal data being provided to data input latches 16 for storage in this write operation. This makes it possible to determine whether errors are being introduced in the data being stored or received by faults in the circuitry of the data input latch 16, sense amplifiers 21, or the data output latches 18. If no error is detected in this manner, any later found errors must be due to malfunctions within array 12.

Control circuit 30 of FIGS. 1 and 2 permits for isolation of faults occurring within the modified memory between the array portion 12 and the input/output portions of that memory without any additional interconnection pads being provided in the semiconductor chip housing this memory. This is accomplished by merely altering the timing of the logic state voltage signal $V_{48}$ provided to system read/write control input terminal 48.

Control circuit 30 also permits normal read operations. A high logic state in system read/write control voltage signal $V_{48}$ at terminal 48 is provided with a high logic state at the time system clock voltage signal $V_{46}$ rises from a low to a high logic state. As a result, flip-flop 32 will have a high voltage state maintained in voltage signal $V_{40}$ at the output of gate 40, and so voltage signal $V_{50}$ will have a low logic state at terminals 50 and 20 to thereby specify a read operation. Signal $V_{70}$ will continue to be unaffected by signal $V_{48}$ and so will continue the waveform shown therefor in FIG. 3 to permit sensing by sense amplifiers 21. Signal $V_{64}$ will have a low logic state output pulse in each read operation during the system clock signal transition delay through delay circuit 54 since signal $V_{48}$ will have a high logic state therein at that time described above used for specifying the occurrence of a read operation.

Although the present invention has been described with reference to preferred embodiments, workers skilled in the art will recognize that changes may be made in form and detail without departing from the spirit and scope of the invention.

What is claimed is:

1. A memory means having a control circuit for selecting between a retrieval procedure for retrieving from therein information to be presented at data outputs thereof, a direct storage procedure for storing therein information that is presented at data inputs thereof, and a storage with test procedure for storing therein information presented at said data inputs thereof and for passing such information presented at these said data inputs to said data outputs thereof, said selecting of said procedures and initiation of that one selected being under control of both a periodic system clock signal provided at a memory clock signal input terminal means of said memory means adapted for connection to a source of such a system clock signal and a system read/write signal provided at a memory read/write signal input terminal means of said memory means adapted for connection to a source of such a system read/write signal, said memory means comprising:

a memory control and storage cell array means having a plurality storage cells therein each having at least one input thereof and one output thereof electrically connected in common, said storage cells each being capable of storing information therein presented at its input and alternatively being capable of providing information previously stored therein at its output, said storage cell inputs therein electrically connected to said memory means data inputs to receive information therein, said memory control and storage cell array means further having a control input for receiving a memory read/write signal to select whether said memory control and storage cell array means, in a period of said system clock signal, is to either store therein information provided at its said storage cell inputs or retrieve information previously stored therein to be presented at its said storage cell outputs;

a set of memory output data latches having a data input electrically connected to said memory control and storage cell array means storage cell outputs, said set of memory output data latches having a data output electrically connected to said memory means data outputs, said set of memory output data latches each being capable of storing therein information occurring on a said memory output data latch data input so that such information is presented and maintained on its output even though there are subsequent changes in said information occurring at its input, or of preventing such storing of information therein but rather passing information changes provided at its input to its output as they occur, said set of memory output data latches further having a control input for receiving an output latch signal to select whether to permit storing of information provided at its inputs or passing changes therein to its outputs as they occur, and;

a control circuit means comprising:

a read/write indicator means having a pair of inputs one of which is electrically connected to said memory clock signal input terminal means and that one remaining being electrically connected to said memory read/write signal input terminal means, said read/write indicator means also having an output electrically connected to said memory control and storage cell array means control input, said read/write indicator means being capable of forming said memory read/write signal by providing an indication on said output thereof in each period of said system clock signal, based on an initial indication in said system read/write signal in that period, whether said memory control and storage cell array means is in that period to store information occurring on said memory means data inputs or to retrieve information stored therein for presentation on said memory means data outputs; and a latch control means having a pair of inputs one of which is electrically connected to said memory clock signal input terminal means and that one remaining being electrically connected to said memory read/write signal input terminal means, said latch control means also having an output electrically connected to said control input of said set of memory output data latches, said latch control means being (i) capable, in each period of said system clock signal in which said system read/write signal initial indication in that period indicates that said memory control and storage cell array means is to retrieve information, as aforesaid, of providing an indication during that period on said output thereof that said memory output data latch is to store information therein, as aforesaid, and (ii) capable, in each period of said system clock signal in which said system read/write signal initial indication in that period indicates that said memory control and storage cell array means is to store information, as aforesaid, of providing an indication during that period on said output thereof that said memory output data latch is to (a) store information therein as aforesaid for a first further indication in said system read/write signal in that period, and is to alternatively (b) prevent storage of information therein for an alternative second further indication in said system read/write signal in that period.

2. The apparatus of claim 1 wherein said memory means further comprises a set of sensing amplifiers through which said set of memory output data latches is connected to said memory control and storage cell array means storage cell outputs, as aforesaid, with said set of sensing amplifiers having a set of data inputs electrically connected to said memory control and storage cell array means storage cell outputs, said sensing amplifiers having a set of data outputs which are electrically connected to said memory output data latches data inputs, said set of sensing amplifiers each being capable of sensing an occurrence of information on said memory control and storage cell array means storage cell outputs and amplifying such information to present it at said set of sensing means data outputs, or of preventing such sensing and amplifying by said set of sensing amplifiers, further having a control input for receiving a sense amplifier signal to select whether to permit said set of sensing amplifiers to sense and amplify or not, said sensing amplifiers and wherein said control circuit means further comprises a sense control means having an input electrically connected to said memory clock signal input terminal means and an output electrically connected to said control input of said set of sensing amplifiers, said sense control means being capable in each period of said system clock signal of providing an indication on said output thereof when in that period said set of sensing amplifiers is to sense and amplify as aforesaid.

3. The apparatus of claim 1 wherein said read/write indicator means is formed of a R-S flip-flop having its inputs serving as said read/write indicator means pair of inputs, and having one of its outputs electrically connected to said read/write indicator means output.

4. The apparatus of claim 1 wherein said latch control means comprises a first delay means having an input serving as that input of said latch control means electrically connected to said memory clock signal input terminal means, and an output electrically connected to an input of an inverter, said inverter having its output electrically connected to an input of a second delay means also having an output, and further comprises a logic gate having at least three inputs, one said logic gate input being electrically connected to said first delay means output, another said logic gate input being electrically connected to said second delay means output, and yet another said logic gate input serving as that input of said latch control means electrically connected to said memory read/write signal input terminal means.

5. The apparatus of claim 2 wherein said sense control means comprises a logic gate having at least two inputs, one of said logic gate inputs being electrically connected to an output of a delay system which delays signals applied thereto and inverts such signals, said delay system having an input which is electrically connected to another input of said logic gate and to said sense control means input.

6. The apparatus of claim 2 wherein said latch control means comprises a first delay means having an input serving as that input of said latch control means electrically connected to said memory clock signal input terminal means, and an output electrically connected to an input of an inverter, said inverter having its output electrically connected to an input of a second delay means also having an output, and further comprises a logic gate having at least three inputs, one said logic gate input being electrically connected to said first delay means output, another said logic gate input being electrically connected to said second delay means output, and yet another said logic gate input serving as that input of said latch control means electrically connected to said memory read/write signal input terminal means.

7. The apparatus of claim 6 wherein said sense control means comprises said first and second delay means and said inverter, and further comprises a third delay means having an input electrically connected to said second delay means output and an output electrically connected to an input of a logic gate having at least two inputs, said logic gate having another input thereof electrically connected to said input of said first delay means.

8. A method for operating a memory means in a storage-with-test mode to permit verifying, to an extent, of information presented at inputs thereof for storage therein and having a memory control and storage cell array means which can be directed by one logic state of a memory read/write control signal to store information presented at inputs thereof in a period of a periodic system clock signal, and can be directed by an opposite state of such a memory read/write control signal to retrieve information previously stored therein in a period of said system clock signal to be presented to outputs thereof, said memory control and storage cell array means having common interconnections on which information at inputs thereof can be presented to said memory control and storage cell array means for storage therein, and can also be presented directly from said inputs to an output latch means for verification, and on which information stored on said memory control and storage cell array means can be retrieved from storage therein and presented to said output latch means, said method comprising:

providing to said memory means in a selected period of said system clock signal a system read/write signal having an initial logic state sufficient to cause said memory means to store therein information provided at its said inputs through forming said memory read/write control signal first logic state which state is maintained during said period of said system clock signal even though said system read/write control signal changes its logic state;

providing information in said selected period to said memory control and storage cell array means at inputs thereof;

changing in said selected period said initial logic state in said system read/write control signal and providing an output latch signal to said output latch means based on said change in said system read/write control signal logic state to cause said output latch means to pass information received on said common interconnections directly from said inputs to outputs of said memory means, including any changes in said information as they occur; and comparing said information passed through said output latch means with said information provided to said inputs of said memory means to determine whether any differences exist.

* * * * *